(12) United States Patent
Wakchaure et al.

(10) Patent No.: US 9,483,397 B2
(45) Date of Patent: Nov. 1, 2016

(54) ERASE MANAGEMENT IN MEMORY SYSTEMS

(71) Applicants: Yogesh B. Wakchaure, Folsom, CA (US); David J. Pelster, Longmont, CO (US); Xin Guo, San Jose, CA (US)

(72) Inventors: Yogesh B. Wakchaure, Folsom, CA (US); David J. Pelster, Longmont, CO (US); Xin Guo, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 13/943,762

(22) Filed: Jul. 16, 2013

(65) Prior Publication Data

US 2015/0026386 A1 Jan. 22, 2015

(51) Int. Cl.
*G06F 12/02* (2006.01)

(52) U.S. Cl.
CPC ... *G06F 12/0246* (2013.01); *G06F 2212/7205* (2013.01); *G06F 2212/7211* (2013.01)

(58) Field of Classification Search
CPC .. G06F 12/0246; G06F 3/0679; G06F 3/064; G06F 3/0688; G06F 2212/7205; G06F 2212/7211; G06F 11/3055; G06F 12/023; G06F 12/0866; G06F 2212/222; G06F 2217/84; G06F 3/0647; G06F 3/0659; G06F 2212/2022; G06F 3/0616; G06F 3/0619; G06F 3/0653
See application file for complete search history.

(56) References Cited

U.S. PATENT DOCUMENTS

| | | | | |
|---|---|---|---|---|
| 5,524,230 | A | * | 6/1996 | Sakaue et al. ............... 711/103 |
| 5,808,937 | A | * | 9/1998 | Chi ..................... G11C 11/5621 365/185.03 |
| 8,040,744 | B2 | * | 10/2011 | Gorobets et al. ............. 365/200 |
| 8,572,311 | B1 | * | 10/2013 | Shalvi et al. ................. 711/103 |
| 2006/0002197 | A1 | | 1/2006 | Rudelic |
| 2008/0168213 | A1 | * | 7/2008 | Kim .............................. 711/103 |
| 2010/0049907 | A1 | * | 2/2010 | Kitsunai et al. .............. 711/103 |
| 2010/0293320 | A1 | | 11/2010 | Li et al. |
| 2011/0022778 | A1 | * | 1/2011 | Schibilla et al. ............. 711/103 |
| 2011/0107009 | A1 | | 5/2011 | Scouller et al. |
| 2011/0113183 | A1 | | 5/2011 | Lee et al. |
| 2012/0324145 | A1 | | 12/2012 | Teo |

OTHER PUBLICATIONS

International Search Report, PCT/US2014/046849, Jan. 12, 2014.
International Preliminary Report, PCT/US2014/063853, Jan. 28, 2016.

* cited by examiner

*Primary Examiner* — Hashem Farrokh
(74) *Attorney, Agent, or Firm* — Chapin IP Law, LLC

(57) ABSTRACT

Computer processor hardware receives notification that data stored in a region of storage cells in a non-volatile memory system stores invalid data. In response to the notification, the computer processor hardware marks the region as storing invalid data. The computer processor hardware controls the magnitude of erase dwell time (i.e., the amount of time that one or more cells are set to an erased state) associated with overwriting of the invalid data in the storage cells with replacement data. For example, to re-program respective storage cells, the data manager must erase the storage cells and then program the storage cells with replacement data. The data management logic can control the erase dwell time to be less than a threshold time value to enhance a life of the non-volatile memory system.

29 Claims, 9 Drawing Sheets

US 9,483,397 B2

ERASE MANAGEMENT IN MEMORY SYSTEMS

TECHNICAL FIELD

Embodiments of the present disclosure relate generally to data management in a memory system.

BACKGROUND

Computer systems have long used devices to store data. For example, a conventional Hard Disk Drive (HDD) is a data storage device used for storing and retrieving digital information using rapidly rotating discs. Such discs are coated with magnetic material that persistently stores respective data. As a respective disc rotates, a magnetic head reads data from or writes data to the magnetic material on the surface of the disk.

Another type of conventional technology to store data is a solid state-drive. As its name suggests, a solid state-drive includes one or more solid-state devices or integrated circuits that are configured to persistently store data. There are no actual moving parts in a solid state-drive. Access to data stored in non-volatile memory in the solid state drive is performed using an electronic circuit interface.

One reason for the widespread use of a solid state-drives in lieu of rotating disk drives is speed. For example, access to data in the non-volatile memory is typically much quicker than access to data stored in a disk (e.g., a physically rotating storage medium). A downside of using non-volatile memory as opposed to disk drive storage is cost. For example, the cost per bit to store data in memory can be considerably higher than the cost per bit to store data on a magnetic media disc of a HDD.

Memory systems typically include many storage cells to store bits of information. Proper management of the memory system and respective storage cells is important for longevity and usefulness. Certain management of the many storage elements can cause premature failure.

Storage cells in a non-volatile memory system typically can be used over and over again. For example, a region of storage cells in a non-volatile memory device initially can be programmed to store a set of data. To overwrite the set of data, the region of storage cells first must be erased. New data is then written to the region of storage cells.

DESCRIPTION OF THE EMBODIMENTS

Figure 1:
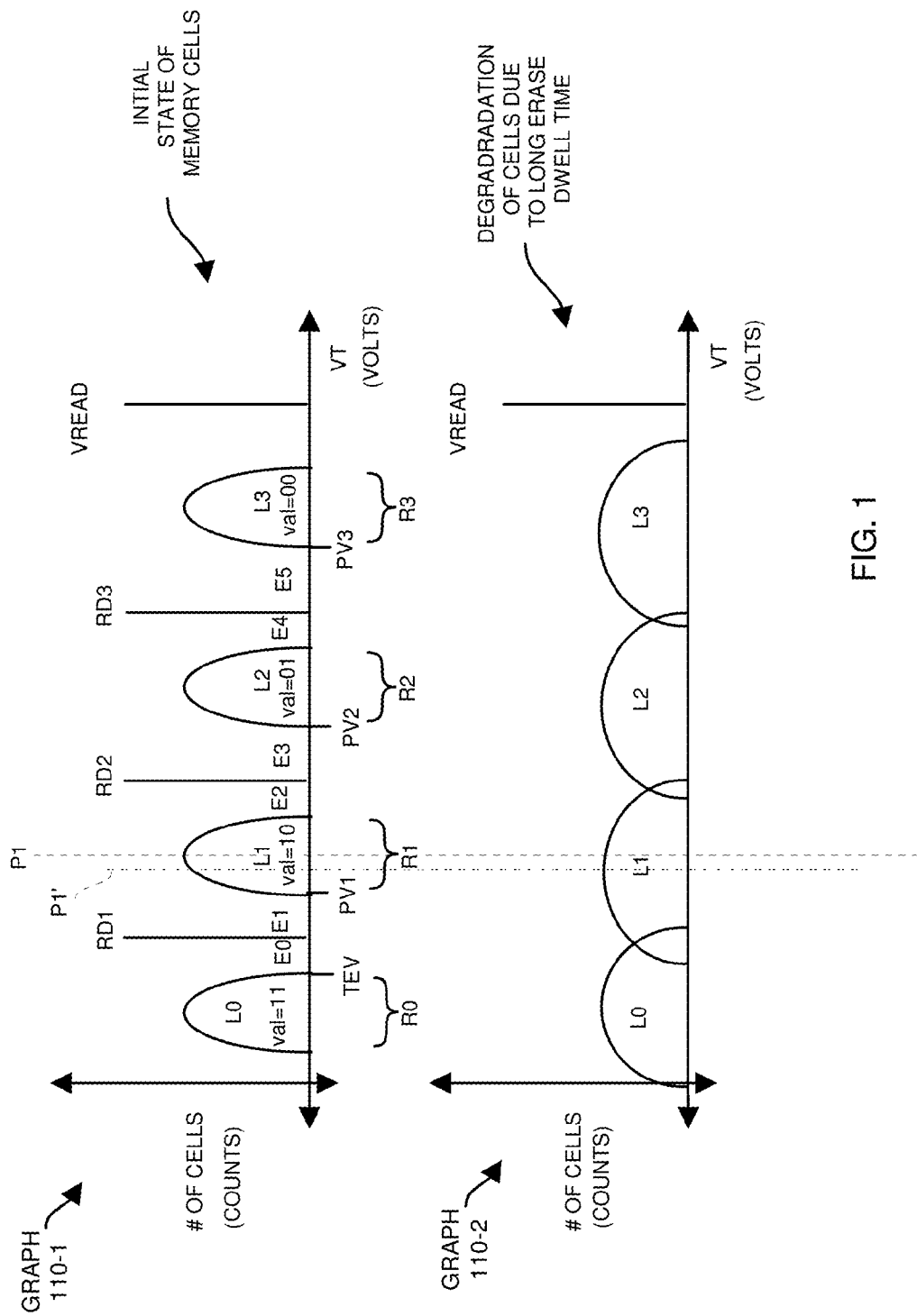
FIG. 1 is an example diagram illustrating degradation in performance of storing data in memory cells according to conventional techniques.

In accordance with one conventional application, a data manager can receive notification that the storage cells in a region of a non-volatile memory (such as NAND memory technology) currently store invalid data. In response to the notification, the data manager immediately erases the region of storage cells to make the storage cells available for subsequent programming. The erased region of storage cells is then placed in a queue. When the system requires additional resources to store data, the data manager allocates a previously erased region to store the new data.

Certain embodiments as discussed herein are based at least in part on the discovery that the length of time that a storage cell in a non-volatile memory is in an erase state can negatively impact an ability of the respective storage cells to store subsequent data. Storage cells in a non-volatile memory device are set to an erase state prior to being subsequently reprogrammed with non-erase type data.

Every cell in a non-volatile memory device is susceptible to some amount of intrinsic charge loss and reduced read window budget (RWB) over time during normal usage of the storage devices. In general, intrinsic charge loss is a leakage of electrons from the floating gate after a programming pulse. Trapped charge as a result of programming initially causes the non-volatile memory device cell's threshold voltage (Vt) to appear higher than the floating gate voltage. However, the leakage of these electrons after programming typically causes a shift in the threshold voltage. RWB represents the sum of edge margins between adjustment threshold states (discussed in more detail with respect to FIG. 1).

When cells in a non-volatile memory device are in an erased state for a long period of time, the rate of intrinsic charge loss increases for subsequently stored data in those cells. The rate of degradation of the RWB margin for those cells is also reduced as a result of exposing storage cells to longer erase dwell times.

In certain instances, a non-volatile memory system can be exposed to heightened temperatures (such as greater than 35 degree Celsius without being powered) for an extended period of time. As mentioned above, the rate of intrinsic charge loss and the amount of RWB margin degradation over time will depend on a length of time that the cells are in an erased state. If storage cells exposed to high temperatures previously were in an erased state for a long period of time, the non-volatile memory system is susceptible to a higher rate of intrinsic charge loss and greater degradation of RWB margins.

One embodiment herein includes controlling the time that storage cells in a non-volatile memory system are in the erased state. For example, in one embodiment, a data manager receives notification that data stored in a region of storage cells in a non-volatile memory system stores invalid data. In response to the notification, the data manager marks the region as storing invalid data. The data manager controls the amount of time that a cell is set to an erased state associated with overwriting of the invalid data in the storage cells with replacement data. For example, to re-program respective storage cells, the data manager erases the storage cells and then programs the storage cells with replacement data. In one non-limiting example embodiment, the data manager controls the time that the cells are in an erased state to be less than a threshold time value to enhance a life of the storage cells and their ability to store data.

Accordingly, instead of immediately erasing the invalid data and waiting a substantial length of time to write respective new data to the storage cells, embodiments herein include delaying an operation of erasing the invalid data in the storage cells to be nearer in time to a time of reprogramming the storage cells with the replacement data. Reducing the time that the cells are in an erased state as discussed herein reduces the rate of intrinsic charge loss and a rate that the RWB margins degrade for the subsequently stored replacement data. Thus, embodiments herein include preserving performance associated with storage cells in a respective non-volatile memory system.

Now, more specifically, FIG. 1 is an example diagram illustrating degradation in performance of storing data in memory cells according to conventional techniques.

As shown in graph 110-1, initially, multiple storage cells of a non-volatile memory device are programmed at different levels L0, L1, L2, and L3. By way of a non-limiting example, each of the multiple storage cells can be a multi-level NAND cell or single-level NAND cell storage element capable of storing two bits of information.

When a value is written to a respective cell, a charge is applied to the floating gate. Different amounts of charge are applied to the respective cell to write a different bit setting to the cell. For example, assuming a 2 bit per cell multi-level cell device, a first amount of charge is applied to set a respective cell to a bit value of 11; a second amount of charge is applied to set a respective cell to a bit value of 10; a third amount of charge is applied to set a respective cell to a bit value of 01; a fourth amount of charge is applied to set a respective cell to a bit value of 00. The voltage Vt (when reading a state of the cell) varies depending on the setting of the respective cell and applied charge.

A Vt reading of a cell within range R0 indicates the cell is set to bit value 11; a Vt reading of a cell within range R1 indicates the cell is set to bit value 10; a Vt reading of a cell within range R2 indicates the cell is set to bit value 01; and a Vt reading of a cell within range R3 indicates the cell is set to bit value 00.

The Vt (threshold voltage) level (representative of the amount of trapped charge during programming) detected for a cell indicates a corresponding state that a respective cell is programmed on a subsequent read of the cell. For example, level L0 in graph 110-1 represents a distribution of Vt for multiple cells in a memory device programmed with data=11; level L1 represents a distribution of Vt for multiple cells in the memory device programmed with data=10; level L2 represents a distribution of Vt or multiple cells in the memory device programmed with data=01; level L3 represents a distribution of Vt for multiple cells in the memory device programmed with data=00.

When read, all storage cells programmed to a level L0 (e.g., data value 11) produce a respective Vt within range R0; all storage cells programmed to a level L1 (e.g., data value 10) have a respective Vt within range R1; all storage cells programmed to a level L2 (e.g., data value 01) have a respective Vt within range R2; all storage cells programmed to a level L3 (e.g., data value 00) have a respective Vt within range R3. The voltage Vt of each represents a voltage level detected by a respective circuit that reads the state of the cell.

Assume in this example that graph 110-1 shows distribution of an initial state of memory cells set to different logic levels just after programming.

Assume further in this example that the memory cells were previously exposed to a long time in an erase state such as much greater than several days. In other words, prior to being programmed to the initial state as in graph 110-1, the memory cells were erased and remained in an erase state for a substantial amount of time (i.e., assume that all storage cells were set to an erase state of level L0 for several days).

Graph 110-2 illustrates degradation of storage performance that occurs as a result of maintaining the storage cells in the erase state for too long. Initially, the distributions of settings are as shown in graph 110-1. However, because the storage cells were in an erase state for a long period of time as previously discussed, the settings degrade over time. More specifically, the rate of intrinsic charge loss is greater as a result of being in the erase state for a long time; the rate of degrading RBW margin is greater as well.

In this example, due to an intrinsic charge loss, over time, the aggregate of Vt distributions for cells programmed in levels L0, L1, L2, and L3 shift to the left from graph 110-1 to graph 110-2. In this example, peak P1 represents a peak distribution at level L1 in graph 110-1; peak P1' represents a peak distribution at level L1 in graph 110-2. As shown, peak P1' is shifted with respect to peak P1. The difference between P1 and P1' represents an amount of the shift.

Additionally, over time, Vt distributions widen from the initial state as in graph 110-1 to the distributions as shown in graph 110-2. For example, the RWB margin in the initial state of programming storage cells equals a sum of ranges E0, E1, E2, E3, E4, and E5 in graph 110-1. Sufficiently large margins between levels ensure that it is possible to distinguish which level a respective storage cell is set. As mentioned, over time, because the storage cells were in the erase state for a substantially long time in this example, the distributions associated with storage cells degrade over time. That is, as shown in graph 110-2, in addition to shifting as discussed above, each of the Vt distributions for different levels L0, L1, L2, and L3 widen such that the RWB margin diminishes to a point where it is difficult or possibly no longer possible to determine proper settings for the storage cells.

For example, a storage cell initially programmed to level L1 in graph 110-1 may appear to be set to level L0 due to shifting and/or widening of a distribution as shown in graph 110-2. Conversely, a storage cell initially programmed to level L0 in graph 110-1 may appear to be set to level L1 due to shifting and/or widening of a distribution as shown in graph 110-2, and so on. Accordingly, the degradation of storage performance as shown in graph 110-2 as caused by being in an erase state for a long time is undesirable.

Figure 2:
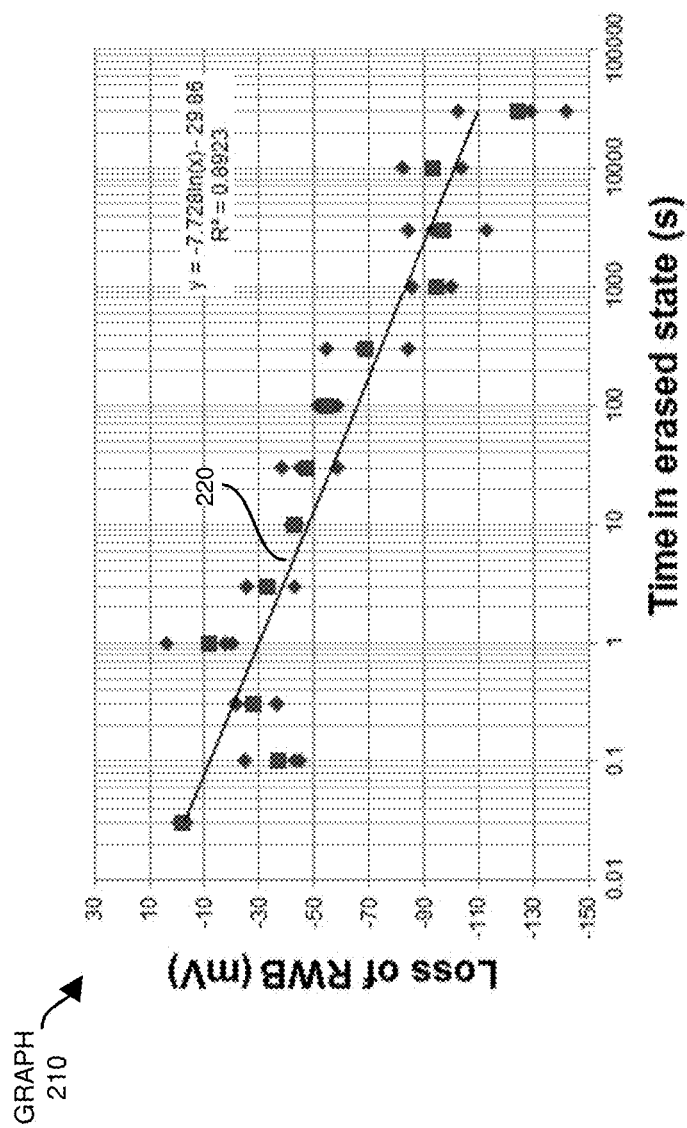
FIG. 2 is an example diagram illustrating a loss of RWB margin according to conventional techniques.

FIG. 2 is an example diagram illustrating a theoretical loss of RWB margin according to conventional techniques.

As shown in graph 210, line 220 indicates a degree to which the RWB margin degrades over time as a result of time spent in the erased state. The x-axis of graph 210 represents time in the erased state in seconds for respective storage cells; the y-axis of graph 210 represents a loss of RWB margin in millivolts (mV). For increased times during which all storage cells are in the erased state, the RWB margin degrades to smaller values, rendering it more difficult to read stored data as mentioned above. The RWB margins may degrade so much that the number of failing bits cannot be corrected using a respective error correction code or other suitable data correcting mechanism in the respective non-volatile memory system. Accordingly, an excessive time spent in the erased state can cause a catastrophic loss of stored data.

Figure 3:
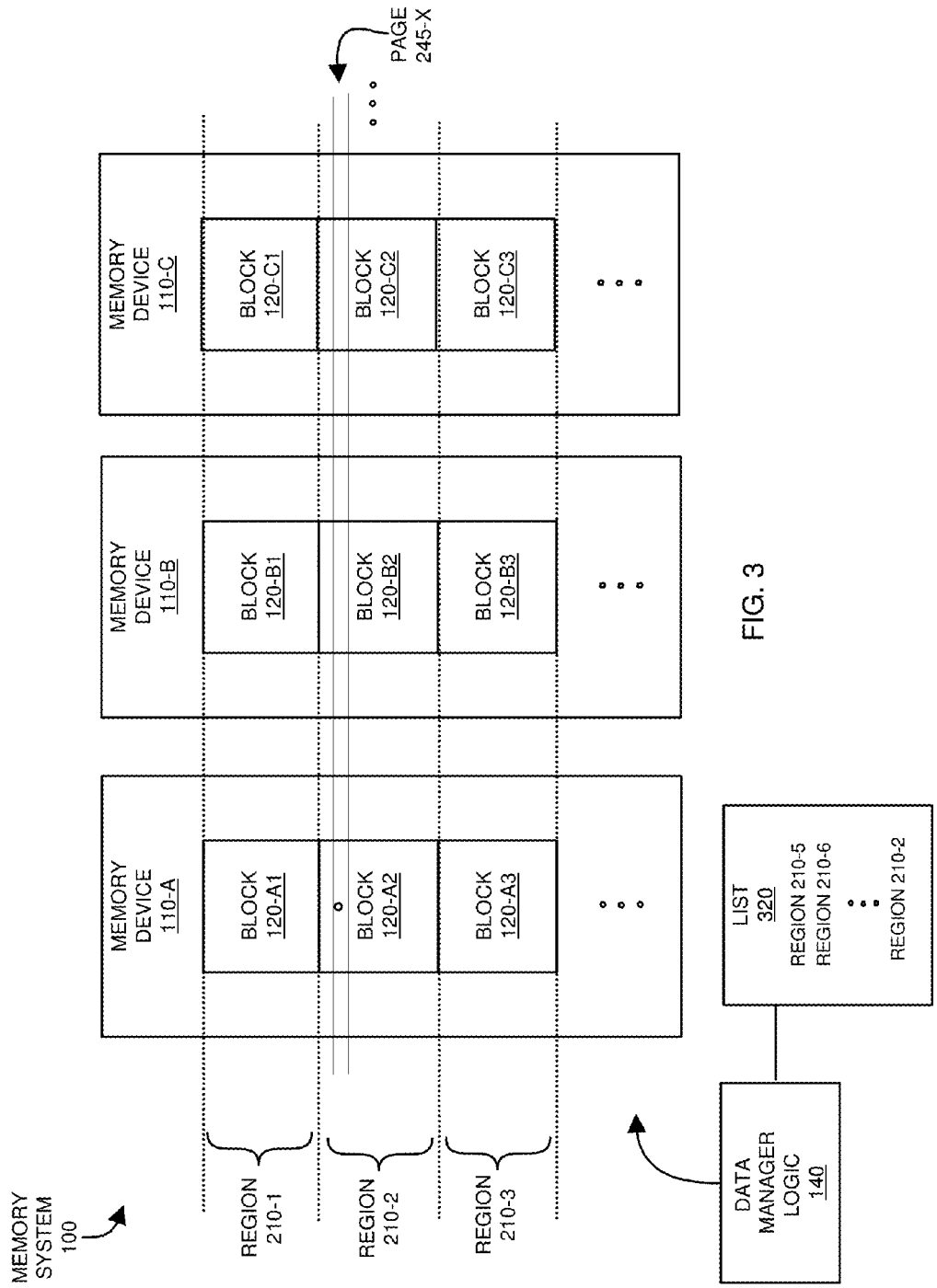
FIG. 3 is an example diagram illustrating a non-volatile memory system according to embodiments herein.

FIG. 3 is an example diagram illustrating a configuration of memory devices in a non-volatile memory system according to embodiments herein.

As shown, example memory system 100 includes data management logic 140 and one or more memory devices such as memory device 110-A, memory device 110-B, memory device 110-C, etc., (collectively, memory devices 110) to store data. The memory system 100 can include a string of any suitable number of memory devices 100.

Memory system 100 may be part of an apparatus such as a Solid State-Drive (SSD) including multiple memory devices. As discussed herein, a technique of data striping (e.g., in which portions of a string of data are stored in each of multiple devices) can be used to store data.

Note that memory system 100 and/or data management logic 140 can include hardware, software, firmware, etc., to perform any of suitable functions (e.g., data access, generation of parity information, memory repair (such as retiring blocks of storage cells that are no longer able to properly store data), data correction, control of time spent in erased state, etc.) as discussed herein.

Note that each of the resources disclosed in FIG. 1 can be any suitable type of resource. For example, the memory devices 110 (e.g., NAND flash, NOR flash, Magnetoresistive Random Access Memory, Ferroelectric Random Access Memory, three-dimensional cross point memory, etc.) can include one or more storage planes (e.g., a two-plane architecture that divides the device into two physical planes, consisting of odd and even blocks) to store data.

The data management logic 140 and/or related components can be executed via any suitable type of resource such as an ASIC (Application Specific Integrated Circuit), computer processor hardware executing instructions, firmware, hardware, software, hybrid of hardware and software etc.

By way of a non-limiting example, each of the memory devices 110 can include multiple storage cells to store respective data. For example, memory device 110-A includes block 120-A1, block 120-A2, block 120-A3, and so on; memory device 110-B includes block 120-B1, block 120-B2, block 120-B3, and so on; memory device 110-C includes block 120-C1, block 120-C2, block 120-C3, and so on.

Each block includes multiple pages; each page in a block includes multiple storage cells to store respective data. As an example, region 210-2 includes page 245-X, such as a string of bit information stored across multiple memory devices 110.

As shown, each region (or band) in memory system 100 can include a stripe of blocks from the multiple memory devices 110. In this non-limiting example embodiment, region 210-1 includes block 120-A1, block 120-B1, block 120-C1, etc.; region 210-2 includes block 120-A2, block 120-B2, block 120-C2, etc.; region 210-3 includes block 120-A3, block 120-B3, block 120-C3, etc.; and so on.

In one non-limiting example embodiment, the memory elements in each block are configured to be multi-level cells; each storage element is capable of storing multiple bits of data as mentioned. As mentioned, depending on the embodiment, each cell may be able to store one or multiple bits of data depending on a bit-per-cell mode setting (e.g., multi-level cell MLC, single level cell SLC, etc.).

Accordingly, the storage resources in the memory devices 110 can be partitioned into multiple regions including region 210-1, region 210-2, region 210-3, etc. In one embodiment, region 210-1 represents a first band, region 210-2 represents a second band, region 210-3 represents a third band, and so on.

At any given time, data stored in one or more of the regions 210 (or portion thereof) can be retired from further use for any number of reasons. For example, data in a respective band can be retired as being invalid as a result of performing defragmentation analysis in which it is determined whether related data stored across multiple locations in memory is better stored in a different manner such as next to each other for performance reasons; data in a respective band can be retired as being invalid as a result of a user executed delete operation indicating that the data is no longer needed; etc.

Upon receiving notification that data stored in a respective region is no longer valid, the data management logic 140 stores an identity of the newly retired region of data in list 320. In this example embodiment, list 320 indicates that region 210-5, region 210-6, . . . , region 210-2, have been retired and all store invalid data (e.g., the data is no longer of any use).

Rather than immediately erase the respective regions having invalid data as indicated by inclusion in list 320, embodiments herein include delaying the operation of erasing the storage cells within the respective regions after they have been retired or labeled as being invalid data.

Assume in this example that data management logic 140 receives notification that data stored in a respective region 210-2 of storage cells in a memory system 100 now stores invalid data. In response to receiving the notification, the data management logic 140 marks the region 210-2 as storing invalid data. This can include storing the identity of the region 210-2 in the list 320. In addition to or alternatively, further embodiments herein can include modifying at least a portion of the data stored in the retired region to indicate that the data stored therein is no longer valid or useful data.

Some time after the region has been marked as storing invalid data, the data management logic 140 writes replacement data to all or a portion of storage cells in the region 210. To provide increased storage performance, and avoid excessive RWB and intrinsic charge loss degradation, the data management logic 140 controls an amount of time in which the storage cells are set to an erased state before subsequent overwriting with the respective replacement data in the storage cells of region 210-2

As described herein, one embodiment herein includes delaying an operation of erasing invalid data in the storage cells in the region 210-2 and replacing the invalid data with the replacement data. For example, the data management logic 140 delays the erase operation (which is required prior to writing the replacement data in the storage cells) to reduce the time that the storage cells are in the erase state to below a predetermined time threshold value. Reducing the erase dwell time to a value below a predetermined time threshold value over subsequent instances of overwriting data in the regions ensures that the memory system 100 will provide a certain level of performance over the course of its useful life.

Figure 4:
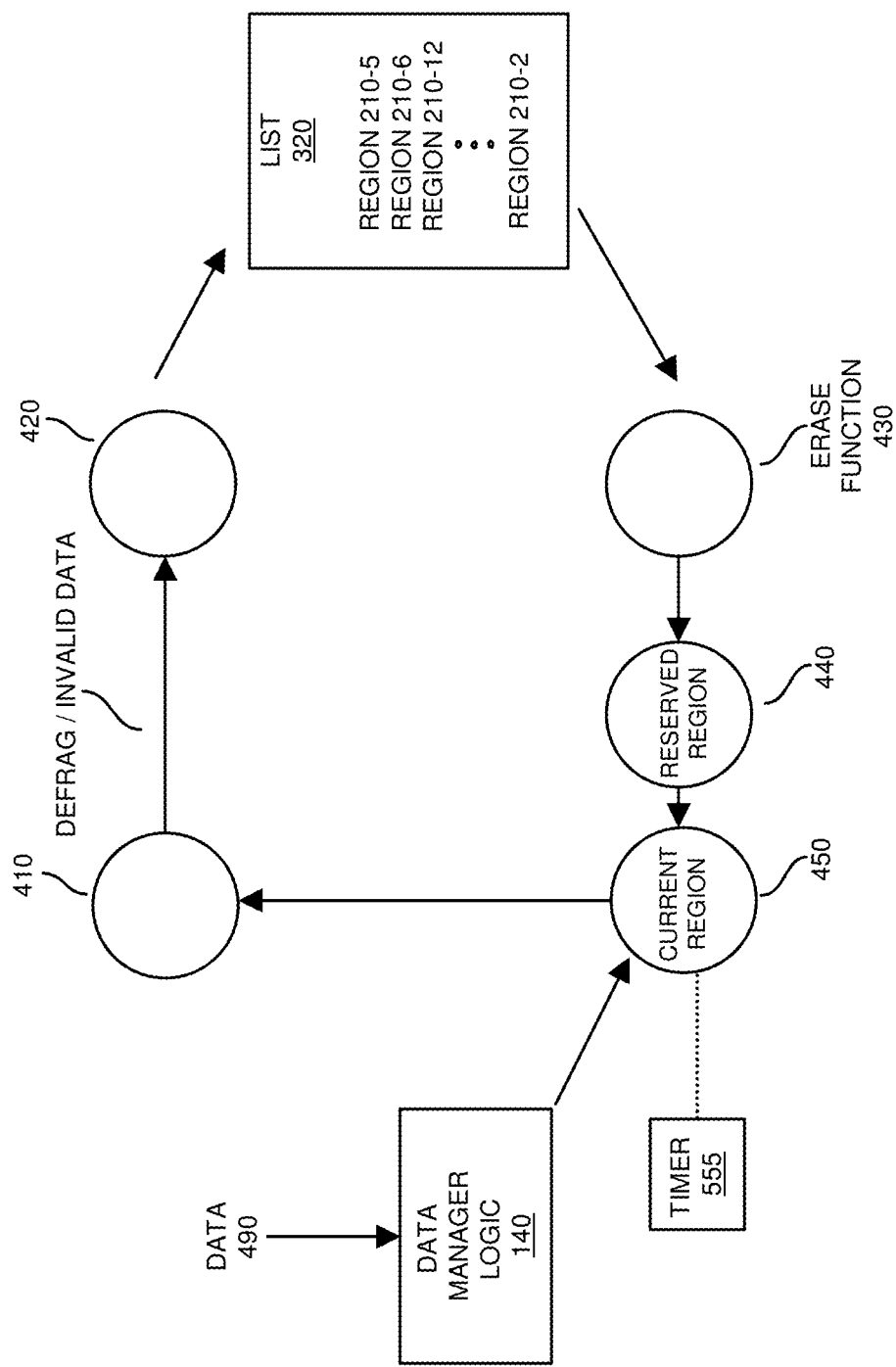
FIG. 4 is an example diagram illustrating management of storage cells in a non-volatile memory system according to embodiments herein.

FIG. 4 is an example diagram illustrating management of storage cells in a non-volatile memory system according to embodiments herein.

At any given time, none, one or more of the regions 210 can store valid data as represented by written state 410. In other words, written state 410 represents portions of the memory system 100 that store valid data.

As previously discussed, certain regions of data stored in memory system 100 can eventually become invalid. State 420 represents regions that have been retired and now store invalid data. In response to detecting that a region has been retired or placed in the invalid data state 420, the data management logic 140 stores an identity of the region including the invalid data in list 320. Any suitable method can be used to mark or tag the retired region.

In one embodiment, as new regions are needed to store replacement data 490 received by the data management logic 140, the data management logic 140 initiates execution of erase function 430. For example, assume that the current region 450 is region 210-3 and that region 210-4 is reserved region 440. Subsequent to completing programming of current region 450 (region 210-3), the data management logic 140 sets the region 210-3 to the written state 410. As discussed below, the region 210-3 can be retired because there are no more free storage cells in which to write new data in region 210-3 or a time may occur. As explained herein, a region of memory can be erased and then written to within a certain window of time. After expiration of the window of time, the region can be retired to a written state 410 in which the region is no longer available for writing data. The region may be retired even though the entire region has not been written with valid data. Accordingly, erase time of a region is less than the window of time. Further details are discussed below. Note that storage cells in region 210-4 are set to an erase state by erase function 430 when the region 210-4 was allocated as the reserved region 440 from list 320.

To fill the vacancy in reserved region 440 (because region 210-4 was moved to the current region 450), the data management logic 140 applies erase function 430 to the next available region (e.g., region 210-5) in list 320. Application of the erase function 430 includes erasing substantially all storage cells in a respective region to an erase state. After designating region 210-4 as the current region 450, the data management logic 140 designates the region 210-5 (in the erased state) as the reserved region 440.

In one embodiment, the data management logic 140 starts timer 555 at a time of setting the region 210-4 as the current region 450, during which any available replacement data 490 is stored in region 210-4. Timer 555 keeps track of how long the region 210-4 is designated as the current region 450 and is used by the data management logic 140 to store newly received data 490.

It is possible that the data management logic 140 does not receive a sufficient quantity of replacement data 490 to program all storage cells within region 210-4 within a specific time frame. Recall that the current region 450 was recently erased. Recall also that it is desirable to reduce the erase dwell time (i.e., a time in which the storage cells in a respective region are set to an erase state prior to being written with valid data). In one embodiment, in response to detecting that timer 555 reaches a time threshold value such as 1.5 days after region 210-4 is set to be the current region 450, and regardless of whether all storage cells in the region 210-4 have been completely written with new replacement data 490, the data management logic 140 retires the region 210-4 to the written state 410. Retiring of the region 210-4 to the written state 410 (as opposed to leaving it in as the current region 450 indefinitely) means that the region 210-4 is no longer available for writing additional data. This keeps the erase dwell time for the region 210-4 under a threshold value. For example, region 210-4 is stored in an erase state as reserved region 440 for at most 1.5 days (a threshold amount of time); region 210-4 is stored in an erase state as current region 450 for at most 1.5 days (a threshold amount of time). Thus, in this example embodiment, the region 210-4 is in the erased state for a maximum of 3 days.

In one embodiment, a portion of the erased storage cells (if such erased storage cells are not written to when the region 210-4 is the current region 450), are programmed with non-erase values (such as value 01, value 10, or value 00) just before the current region 450 is retired to the written state 410. Thus, regions retired to the written state 410 are not filled completely with erase values (such as data value 11). This limits an amount of time that the storage cells in region 210-4 remain in the erased state.

Based on transitioning the region 210-4 from list 320 (such as a queue) to reserved region 440 and to current region 450, storage cells in the region 210-4 experience an erase dwell time of up to 3 days as mentioned above. More specifically, the region 210-4 resides at most in the reserved region 440 for 1.5 days; the region 210-4 resides in current region 450 for at most 1.5 days. Thus, all or a portion of the storage cells in region 210-4 experience a maximum erase dwell time of 3 days. In a similar manner, each of the regions can experience a maximum erase dwell time of 3 days. Of course, the maximum erase dwell time need not be 3 days and can be any suitable value.

Also, note that the regions may not reside in the erased state for the maximum amount of time because the data management logic 140 can be configured to immediately store data 490 in respective storage cells of region 210-3 and region 210-4. In such an instance, the erase dwell time for each region is much less than 3 days. The erase dwell time can be on the order of less than 1 second.

Controlling the erase dwell time in this manner reduces a rate of intrinsic charge loss and a rate of RWB margin loss associated with the replacement data 490 stored in the storage cells of region 210-4 (and other regions). As mentioned, the rate of intrinsic charge loss and rate of RWB margin loss depends on an amount of time in which the settings of the storage cells in region 210-4 are set to an erase state prior to storage of the replacement data in the storage cells.

As mentioned, it is possible that region 210-3 (when designated as the current region 450) fills with replacement data 490 prior to a timeout occurring. In such an instance, the data management logic selects and shifts the reserved region 440 as being the new current region 450. In doing so, the data management logic 140 delays the operation of erasing the invalid data in each of the regions as in list 320. The data management logic 140 can be configured to monitor a need for new storage space to store replacement data 490 in the memory system 100.

As an alternative to immediately erasing the invalid data in respective retired regions as specified in list 320, the data management logic 140 can be configured to erase the invalid data in the storage regions as there is a need to store the replacement data 490. In other words, the data management logic 140 maintains the settings of storage cells in a previously programmed state of storing invalid data until the erase function 430 receives a command to erase the storage cells. As previously discussed, the command received by the erase function 430 from the data management logic 140 can be received in response to detecting that a reserve band (such as reserved region 440) has been reallocated as a current band (such as current region 450) in which to store newly received data. The data management logic 140 designates the newly erased region of storage cells as the reserved region 440.

Note that current region 450 and reserved region 440 can include any number of regions. For example, the data management logic 140 may be able to detect when and how many regions will be needed to store replacement data 490. In such an instance, the data management logic 140 can be configured to control a rate of erasing the regions and making them available as reserved regions.

Having at least one region available in the reserved region 440 ensures that the data management logic 140 will not be delayed when storing replacement data 490 in memory system 100. For example, upon transitioning of a reserved region 440 to current region 450, the data management logic 140 initiates erasing of a new region as reserved region 440 so that the next region is erased before it will be needed. In one embodiment, erase time of a region is 3 to 10 milliseconds. Program time to modify settings of storage cells in a region or band can be approximately 1 second.

Figure 5:
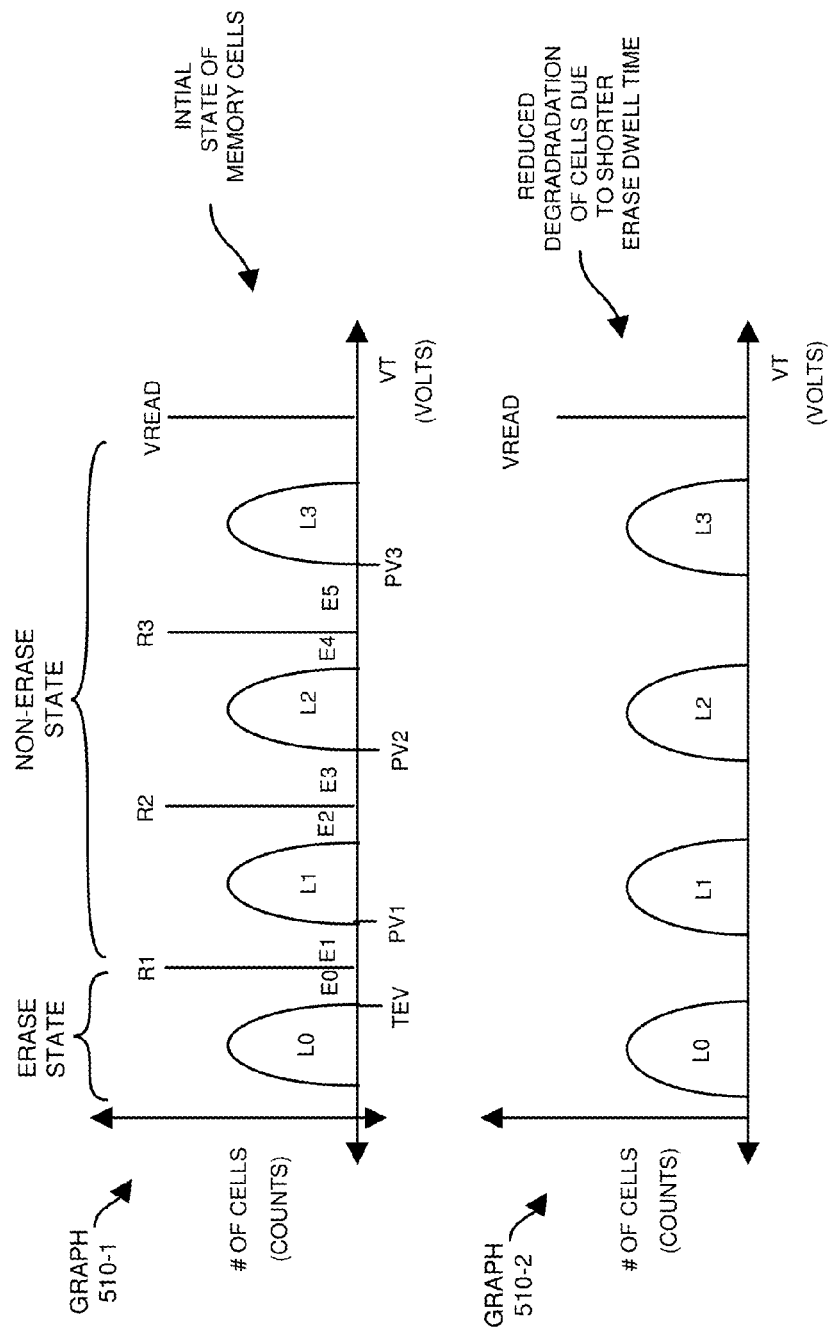
FIG. 5 is an example diagram illustrating reduced performance degradation of storing data in storage cells according to embodiments herein.

FIG. 5 is an example diagram illustrating reduced performance degradation of storing data in storage cells according to embodiments herein.

In contrast to FIG. 1 as discussed above, FIG. 5 illustrates the usefulness of delaying and/or reducing a time in which the cells are set to an erased state according to embodiments herein. As shown, the storage cells may experience some amount of degradation due to being erased. For example, assume that the storage cells were written with values having a distribution as shown in graph 510-1. Graph 510-2 illustrates a state of the storage cells after an amount of time. There is a slight shift of distributions to the left in graph 510-2 with respect to graph 510-1. However, as shown, the shortened erase dwell time ensures that degradation of stored data occurs at a much slower rate than when storage cells experience long erase dwell time as shown in FIG. 1.

Figure 6:
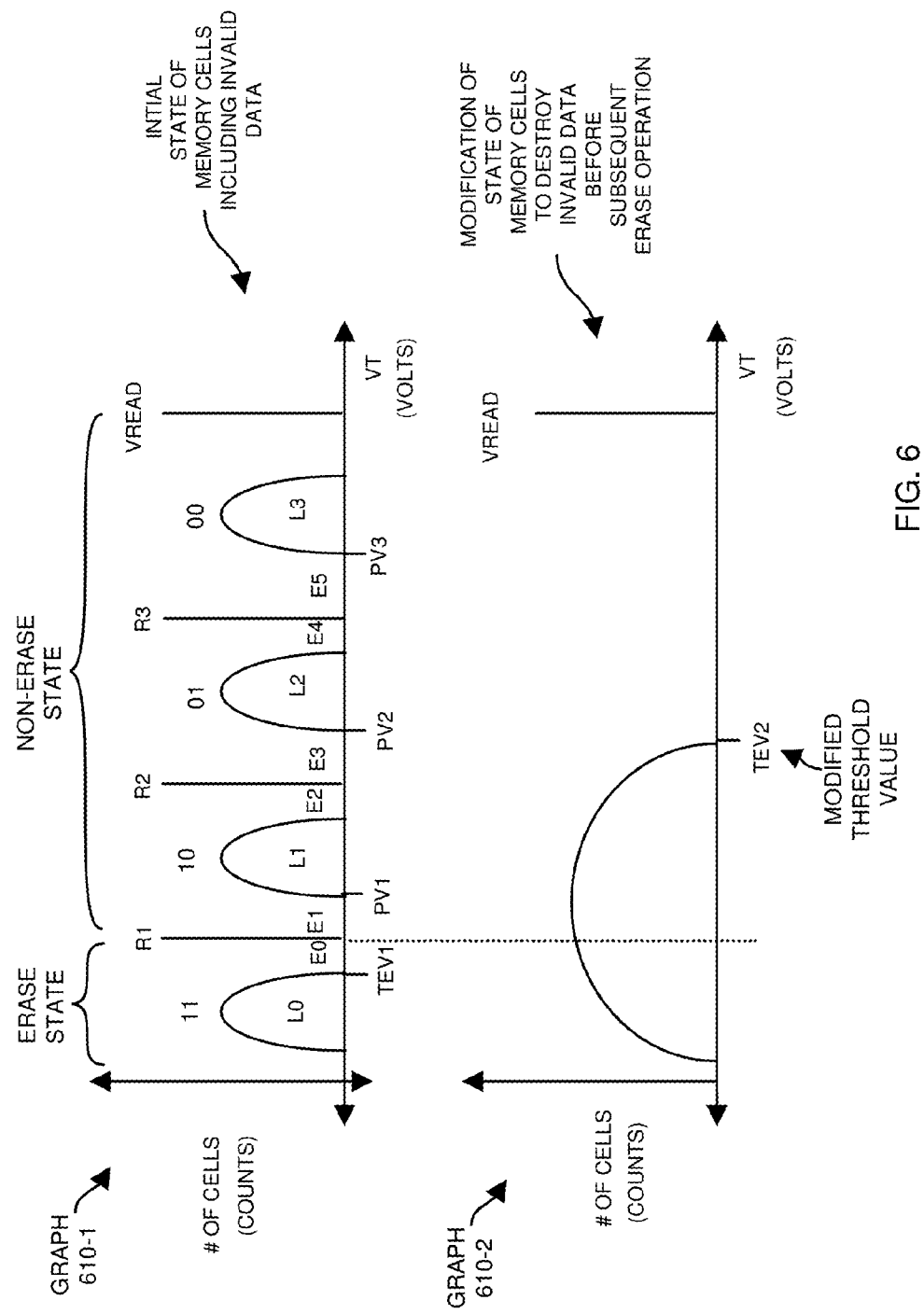
FIG. 6 is an example diagram illustrating a partial erase of data in storage cells according to embodiments herein.

FIG. 6 is an example diagram illustrating a partial erase of data in storage cells according to embodiments herein.

There may be instances in which it is desirable to prevent access to or destroy the invalid data prior to being erased via erase function 430. The queuing of regions in list 320 as discussed herein can result in the respective region storing invalid data for a substantial amount of time.

One way of destroying invalid data after it has been retired and moved to list 320 is to erase data in a respective region of storage cells to destroy the invalid data upon receiving notification that the region stores 100% invalid data. To render the data unavailable, embodiments herein can include erasing the region and programming the region of storage cells with temporary data. As mentioned, the identity of the region that has been retired may remain in the list 320 for a substantial amount of time. In accordance with one embodiment, instead of storing the invalid data while the identity of region is queued in list 320, the respective region stores the temporary data prior to subsequently being overwritten with the new data 490. This embodiment may affect a life of the memory system 100 because it requires an extra operation of pre-programming storage cells in a retired region with the temporary data. The temporary data is subsequently erased and overwritten with the replacement data 490. The temporary data can have a similar distribution as the data shown in graph 510-1.

Another way of destroying the invalid data is to perform a so-called partial erase of the newly retired region. In such an instance, the data management logic 140 programs at least a portion of the storage cells in the region to non-erase states (e.g., states other than level L0).

As a further example, graph 610-1 illustrates an example distribution associated with storage cells in a region. Assume that graph 610-1 represents settings of invalid data in a region to be destroyed. In one embodiment, the data management logic 140 increases the erase threshold value TEV1 associated with storage cells to be approximately equal to the value PV2 (or some other suitable value greater than TEV1) in graph 610-1. In other words, the data management logic 140 sets the erase threshold value to TEV2 as shown in graph 610-2.

The data management logic 140 then modifies bit settings of the storage cells in the newly retired region to fall within a range defined by the increased erase threshold value (modified erase threshold value TEV2). The original erase threshold value TEV1 was used as a basis to define original settings associated with the storage cells as shown in graph 610-1.

The data management logic 140 modifies the settings of storage cells in the region to produce the distribution of settings as shown in graph 610-2. This new distribution includes setting a sufficient number of storage cells in the newly retired region to non-erase states outside of level L0. This type of erase destroys the invalid data in the storage cells so that the invalid data is no longer available. Additionally, because the distribution effectively spans across an erase state (e.g., level L0) and at least a non-erase state (such as level L1, range E1, range E2), the region of storage cells is not substantially affected by the long time in the erase state as previously discussed. In other words, the distribution of settings in the modified storage cells as shown in graph 610-2 is diverse enough that it is not detrimental to the storage cells if unchanged for extended periods of time.

Note that all or a portion of the storage cells in the respective region can be partially erased so that the invalid data is no longer accessible.

In view of the above embodiments, further embodiments herein can include receiving a command to modify the invalid data in the storage cells to prevent access and use of such data. In response to receiving the command, the data management logic 140 modifies a less-than-all portion of the settings of the data cells in the region to a non-erase state in which the invalid data becomes corrupted or destroyed. In other words, original data is modified from its original state. A portion or group of storage cells previously set to level L2 and/or level L3 in graph 610-1 are changed to Vt settings around level L1 (non-erase state) and/or level L0 in graph 610-2.

As a more specific example, the region of storage cells as depicted by graph 610-1 may include a sequence of original data such as: storage cell #1=11 (erase state); storage cell #2=10 (non-erase state); storage cell #3=00 (non-erase state); storage cell #4=10 (non-erase state); storage cell #5=11 (erase state); storage cell #6=00 (non-erase state); storage cell #7=01 (non-erase state); storage cell #8=00 (non-erase state); and so on.

Assume that, in response to the region being retired, the data management logic 140 modifies the states via a partial erase as discussed above to render the data unavailable. The region as depicted by graph 610-2, after application of a partial erase may include storage cells configured to store a sequence of data such as: storage cell #1=11 (erase state); storage cell #2=10 (non-erase state); storage cell #3=10 (non-erase state); storage cell #4=10 (non-erase state); storage cell #5=11 (erase state); storage cell #6=10 (non-erase state); storage cell #7=10 (non-erase state); storage cell #8=11 (erase state); and so on.

Note that, as a result of the partial erase as discussed herein, certain storage cells in the newly retired region can be set to threshold values such as between range E0, E1, E2, and E3.

As previously discussed, changing settings of a first group of cells in the region of invalid data from a first non-erase state (such as level L2 and/or level L3) to a second non-erase state (such as level L1) renders the invalid data unavailable.

The modification of the settings of data in the storage cells also avoids the issue of damaging the storage cells since the storage cells are maintained in the state as shown in graph 610-2 for an extended period of time. In other words, the cells do not experience a long erase dwell time when set to the settings in graph 610-2.

Eventually, the retired and partially erased region of storage cells as (settings of which are represented by settings in graph 610-2) is next in the list 320 to be designated as the reserved region 440. In such an instance, the erase function 430 erases all of the storage cells in the region to be within level L0 (the erase state) in accordance with erase threshold value TEV1. As mentioned, the data management logic 140 then writes to (programs) the respective region of storage cells when it is subsequently designated as the current region 450. However, note that when storing replacement data 490 in the storage cells of the region again, the data management logic 140 sets each of the cells to fall within an appropriate level L0, L1, L2, or L3 depending on the replacement data to be stored. Accordingly, upon subsequent read of storage cells in the region, the storage cells will be set to one of multiple states.

Referring again to FIG. 4, note that the list 320 can be stored in a non-volatile memory device such that the data can be recovered upon an unexpected power failure. However, note that in certain embodiments, the list 320 may be corrupted upon a respective power failure. In other words, a power failure may result in a complete loss of the list 320 because the list is stored in volatile memory.

In view of possible power failures of the memory system 100, one embodiment herein can include marking the one or more regions of invalid data to indicate that the respective region includes invalid data. For example, upon detecting that a region has been retired to the invalid state 420, the data management logic 140 can be configured to modify data stored at a predetermined location in the different regions to indicate that the respective region includes invalid data. Subsequent to occurrence of a power failure, upon later power up, the data management logic 140 can be configured to access and utilize settings of data at the predetermined location in a respective region to determine whether the corresponding region stores valid or invalid data. For those regions that store invalid data, the data management logic 140 includes identities of the regions in the list 320 and operates in a manner as discussed above. Such regions in the list 320 that include invalid data are not used to create a logical to physical table enabling mapping of logical addresses to corresponding physical locations in memory where data is stored.

Embodiments herein can include modifying the data at the predetermined location to ensure that a subsequent read failure will occur when attempting to read the predetermined location after power up. In one embodiment, the subsequent read failure by the data management logic after power is restored indicates that a respective region includes invalid data.

As mentioned above, another embodiment herein can include performing a so-called partial erase or corruption (fail subsequent read) in which all or a portion (such as a last page or word line) in a respective band is partially erased. In the partial erase state of graph 610-2, upon subsequent power up of the respective computer device including memory system 100, the data management logic 140 can be configured to attempt to read from a respective page in the region that was partially erased. When the data management logic 140 attempts to read such data in accordance with predetermined levels L0, L1, L2, and L3, an ECC (Error Correction Code) read error or parity error will occur, thus indicating that the region (or band includes invalid data.

Yet another method of recovering after a power failure can include reconstructing an L2P (Logical to Physical) mapping associated with the memory system 100. For example, all of the blocks in a region are initially assumed to store valid data (even if they store invalid data). Data stored in each of the respective bands can be used to determine whether at least one logical block address (LBA) in the L2P mapping points to a location (such as a block) in the respective region. If no Logical Block Address pointer is found to point to any of the blocks in a band when creating the L2P mapping, then the band (e.g., region) is determined to include invalid data. The identity of any regions having all invalid data are then included in list 320.

In accordance with yet further embodiments, the data management logic 140 can be configured to store a copy of the identities of regions in the list 320 in a designated region such as a first page of the current region 450. For example, in one embodiment, the data management logic 140 stores the identities (list 320) in a predetermined location of the current region 450 such as the first page upon designation of the region as the current region 450.

After storing the identities in the current region 450 in the first page, assume that the memory system 100 experiences a power failure in which the memory devices 110 are all depowered without advance notice. For example, an unexpected power failure can occur while the current region 450 is used by the data management logic 140 to store received data. Assume that the power is restored, on the subsequent system power up, the data management logic 140 (or other suitable resource) can be configured to identify which of the regions 210 was designated as the last current region 450 used by the data management logic 140 prior to the power failure.

Any suitable method can be used to determine the last current region 450 subsequent to repowering the system. For example, in one embodiment, prior to the power failure, the data management logic 140 stores the identities in list 320 into a designated page (such as a first page) of the current region 450. Because the power failure occurs, the data management logic 140 is unable to write to the last page of the current region 450. Therefore, the last page of the current region 450 is still in an erased state. Note that all pages in reserved region 440 are set to an erase state. The current region 450 was previously the reserved region 440 and in the erased state.

After a power failure, and repowering of the memory system 100, the data management logic 140 reads the state of the last page of each region in memory system 100. Based on reading the last page of each region, the data management logic 140 identifies two candidate regions (the last current region 450 and the last reserved region 440) as possibly being the last current region 450. The two candidate regions include a last page of erased data. The data management logic 140 reads the first page of the two candidate regions to determine which one is the last current region 450. For example, the one of two candidate regions in which the first page is written to is the region that was the last current region 450. Recall that the data management logic 140 writes the list 320 to the first page of the current region 450. The other candidate region (the previous reserved region 440) will have a page of erased data. Thus, the previous current region 450 will be identifiable as an only partially written band including written data in the first page and erased data in the last page. The reserved region 440 will include a first page of erased data and last page of erased data. In such an instance, it is determined that the region used to be the previous reserved region 440 before the power failure.

After identifying the specific band (or region) that was designated as the current region 450 prior to power loss, the data management logic 140 (or other suitable resource) will read out and recreate list 320 from the corresponding first page of current region 450 and then exclude such regions (e.g., region 210-5, 210-6, 210-12, etc.) in the list from the L2P table construction. Thus, even though the list 320 is stored in volatile memory and may be lost on a power failure, embodiments herein can include recreating the list 320 based on data stored in the current region 450.

Figure 7:
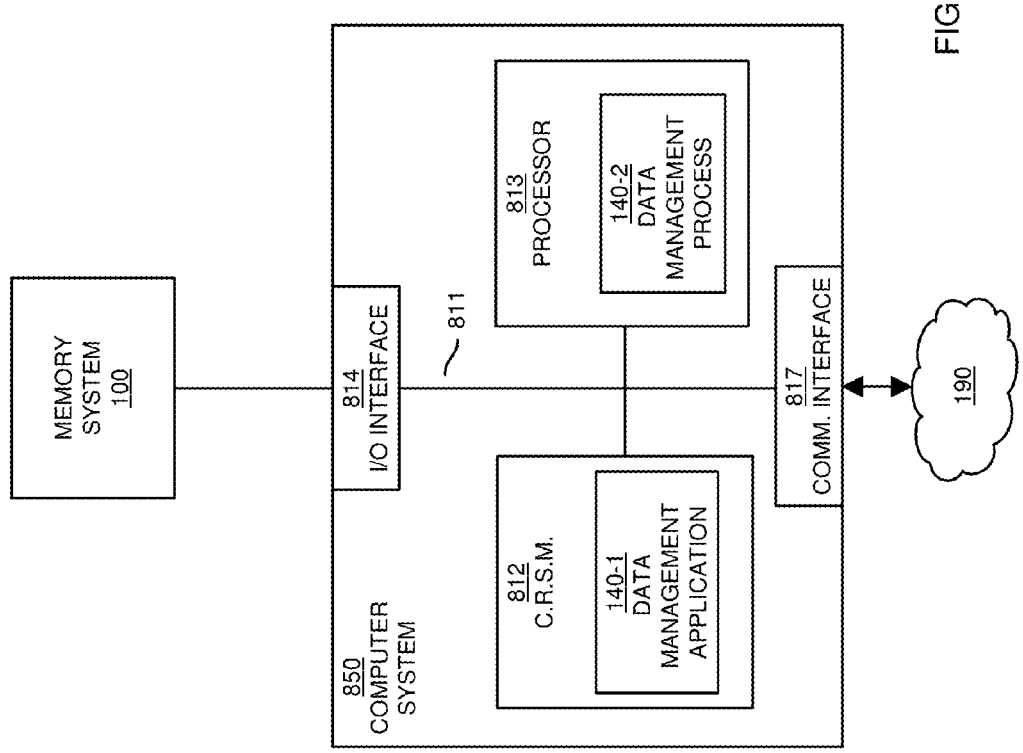
FIG. 7 is an example diagram illustrating a computer architecture that can be used to execute one or more methods according to embodiments herein.

FIG. 7 is an example block diagram of a computer system for implementing any of the operations as discussed herein according to embodiments herein.

Computer system 850 can be configured to execute any of the operations with respect to data management logic 140.

As shown, computer system 850 of the present example can include an interconnect 811 that couples computer readable storage media 812 such as a physical non-transitory type of media (i.e., any type of physical hardware storage medium) in which digital information can be stored and retrieved, a processor 813 (i.e., one or more processor devices), I/O interface 814, communications interface 817, etc.

As shown, I/O interface 814 provides computer system 850 connectivity to data stored in memory devices 220.

Computer readable storage medium 812 can be any physical or tangible hardware storage device or devices such as memory, optical storage, hard drive, floppy disk, etc. In one embodiment, the computer readable storage medium 812 (e.g., a computer readable hardware storage) stores instructions and/or data.

In one embodiment, communications interface 817 enables the computer system 850 and respective processor 813 to communicate over a resource such as network 190 to retrieve information from remote sources and communicate with other computers. I/O interface 814 enables processor 813 to retrieve stored information from a repository such as memory devices 220.

As shown, computer readable storage media 812 is encoded with data management application 140-1 (e.g., software, firmware, etc.) executed by processor 813. Data management application 140-1 can be configured to include instructions to implement any of the operations as discussed herein.

During operation of one embodiment, processor 813 accesses computer readable storage media 812 via the use of interconnect 811 in order to launch, run, execute, interpret or otherwise perform the instructions in data management application 140-1 stored on computer readable storage medium 812.

Execution of the data management application 140-1 produces processing functionality such as data management process 140-2 in processor 813. In other words, the data management process 140-2 associated with processor 813 represents one or more aspects of executing data management application 140-1 within or upon the processor 813 in the computer system 850.

Those skilled in the art will understand that the computer system 850 can include other processes and/or software and hardware components, such as an operating system that controls allocation and use of hardware resources, software resources, etc., to execute data management application 140-1.

In accordance with different embodiments, note that computer system 850 may be any of various types of devices, including, but not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, or in general any type of computing or electronic device.

Functionality supported by the different resources will now be discussed via flowcharts in FIG. 8. Note that the processing in the flowcharts below can be executed in any suitable order.

Figure 8:
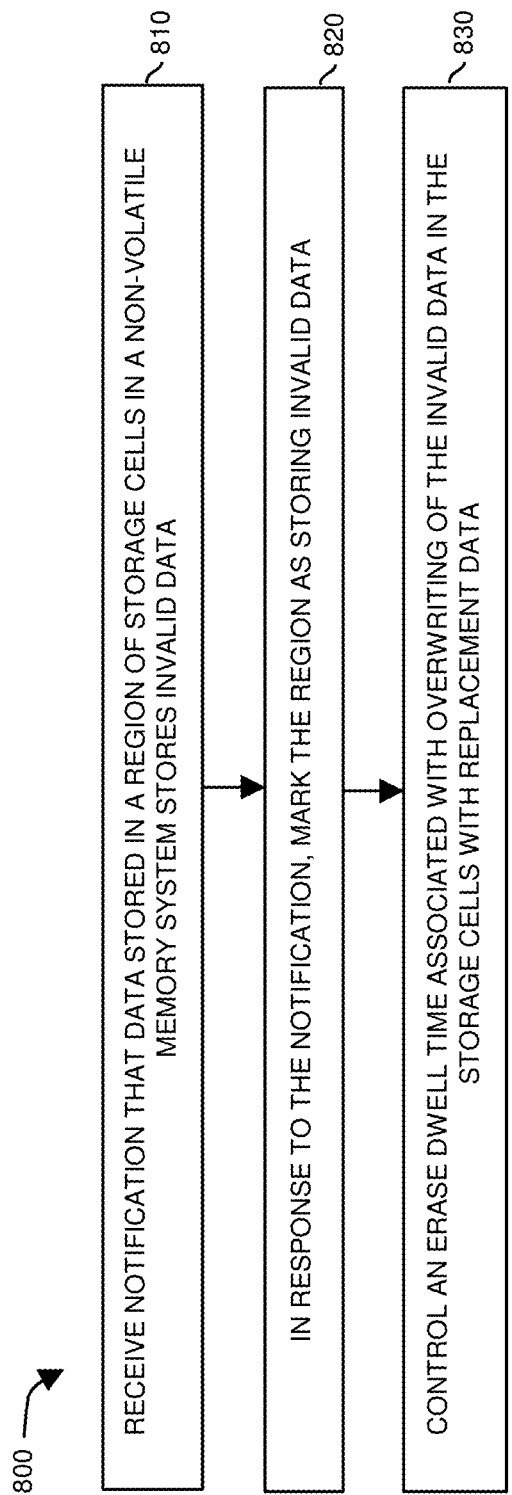
FIG. 8 is an example flowchart illustrating a method according to embodiments herein.

FIG. 8 is a flowchart 800 illustrating an example method according to embodiments. Note that there will be some overlap with respect to concepts as discussed above.

In processing block 810, the data management logic 140 receives notification that data stored in a region of storage cells in a non-volatile memory system stores invalid data.

In processing block 820, in response to the notification, the data management logic 140 marks the region as storing invalid data.

In processing block 830, the data management logic 140 controls the time that the storage cells are in the erase state associated with overwriting of the invalid data in the storage cells with replacement data. By way of a non-limiting example, the data management logic 140 delays erasing of the storage cells to be nearer in time when the storage cells will be programmed with respective replacement data.

Figure 9:
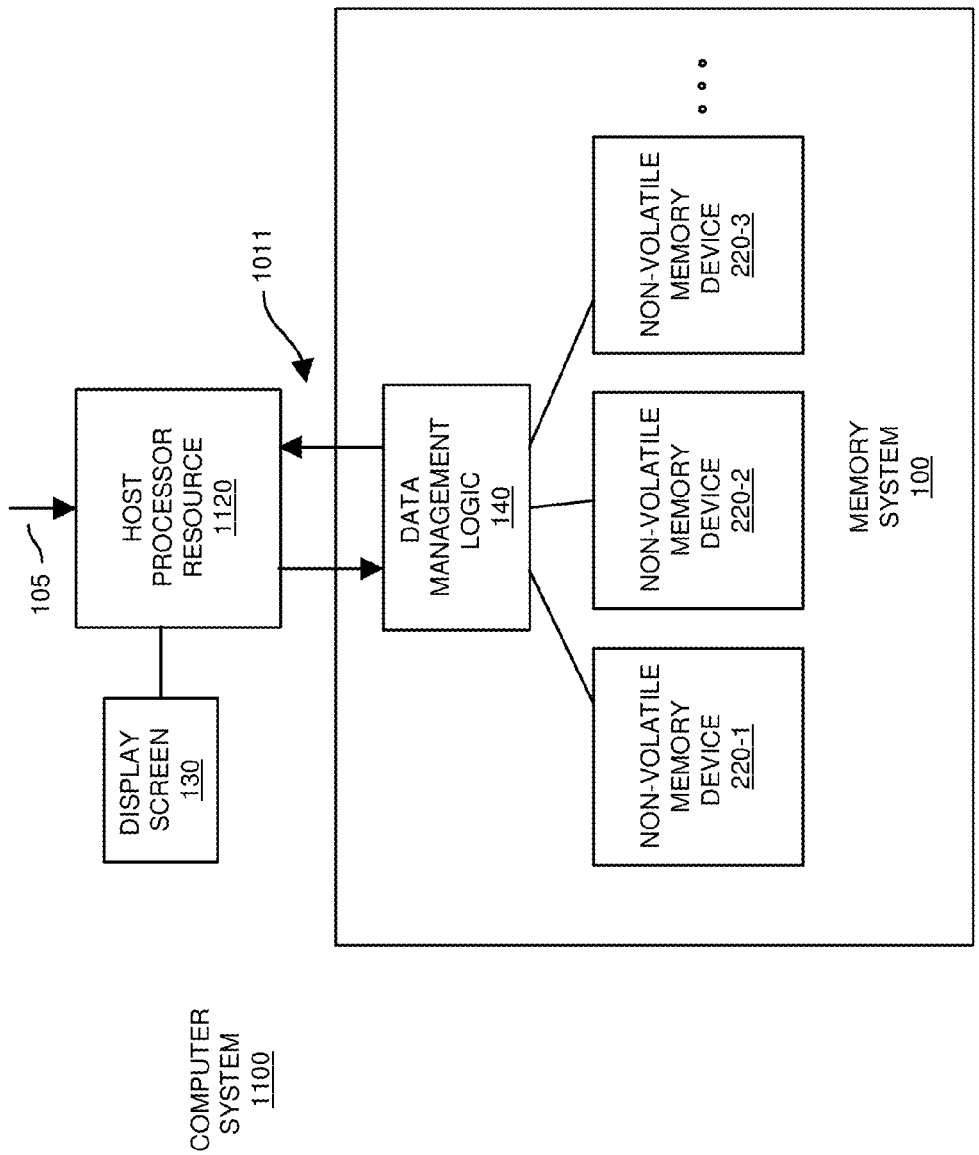
FIG. 9 is an example diagram illustrating use of memory in a respective computer system according to embodiments herein.

FIG. 9 is an example diagram illustrating use of a memory system in a respective computer system according to embodiments herein.

As shown, computer system 1100 can include a host processor resource 1120 and memory system 100. Host processor resource 1120 can be or include computer processor hardware such as one or more processor devices. By way of a non-limiting example, computer system 1100 can be any suitable type of resource such as a personal computer, cellular phone, mobile device, camera, etc., using memory system 100 to store data.

In one embodiment, memory system 100 is a solid-state drive used to store data.

Host processor resource 1120 has access to memory system 100 via interface 1011. Interface 1011 can be any suitable link enabling data transfers. For example, the interface 1011 can be a SCSI (Small Computer System Interface), SAS (Serial Attached SCSI), SATA (Serial Advanced Technology Attachment), USB (Universal Serial Bus), Pcie (Peripheral Component Interconnect Express) bus, etc.

Via interface 1011, the host processor resource 1120 of computer system 1100 is able to retrieve data from and store data in memory system 100.

As an example, assume that the host processor resource 1120 receives a request to perform a respective function as specified by input 105 from a user operating the checkout station 1100. Host processor resource 1120 executes the function, which can include transmitting a request over interface 1011 to data management logic 140 for retrieval of data at a specified logical address. In addition to performing other functions, the data management logic 140 can be configured to map the logical address to an appropriate physical address in memory system 100 and retrieve the data from non-volatile memory devices 220. Subsequent to retrieving the appropriate data from memory system 100, data management logic 140 transmits the retrieved data to host processor resource 1120 satisfying the request for data.

In one non-limiting example embodiment, the host processor resource initiates display of an image on display screen 130 depending on the data received from the data management logic 140.

As a further example, note that the host processor resource 1120 can receive a request to perform a respective function as specified by input 105 from a user. Host processor resource 1120 executes the function and communicates with data management logic 140 to store data at a logical address as specified by the host processor resource 1120. In response to receiving the request, the data management logic 140 maps the logical address to an appropriate physical address and stores the received data in a corresponding location of the non-volatile memory devices 220.

As previously discussed, the data management logic 140 can be configured to manage the erase dwell time associated with programming of storage cells in memory system 100. As previously discussed, a certain amount of degradation may be acceptable as error correction information can be used to repair damaged data. However, reducing the erase dwell time substantially increases a useful life of the memory system 100.

Different Permutations of Disclosed Example Embodiments

A first example embodiment as discussed herein includes a method, the method comprises: in response to receiving a notification that data stored in a region of storage cells in a non-volatile memory system stores invalid data, marking the region as storing invalid data; and controlling a time that the region of storage cells is in an erase state associated with subsequent overwriting of the invalid data in the storage cells with replacement data. The first example embodiment can be implemented along with any of one or more of the following features to produce yet further embodiments below:

In one embodiment, the time represents an amount of time in which the storage cells are set to an erased state before subsequent overwriting with the replacement data. Controlling the time can include: delaying an operation of erasing the invalid data in the storage cells in the region and replacing the invalid data with the replacement data; the delayed operation reduces the time to below a predetermined time threshold value.

Further embodiments herein can include starting a timer substantially around a time of erasing the region of storage cells; monitoring the timer; and, utilizing the erased region of storage cells to store the replacement data prior to the timer reaching a threshold time value.

In accordance with further embodiments, delaying the operation of erasing the invalid data can include: monitoring a need for storage space in the non-volatile memory system; and erasing the invalid data in the storage region in response to detecting a need to store the replacement data in the non-volatile memory system.

In accordance with yet another method embodiment, subsequent to erasing the invalid data, embodiments herein include initiating storage of the replacement data in the storage cells of the region to ensure that the time in which the storage cells are set to an erased state is below the predetermined time threshold value.

Controlling the time can further include reducing a rate of intrinsic charge loss associated with the replacement data stored in the storage cells. The rate of intrinsic charge loss associated with the replacement data depends on an amount of time in which the settings of the storage cells were set to an erase state prior to storage of the replacement data in the storage cells.

In still further embodiments, controlling the time associated with overwriting of the invalid data can include: maintaining the settings of the storage cells in a previously programmed state of storing the invalid data until receiving a command to erase the storage cells, the command received in response to detecting that a reserve band in the non-volatile memory system has been reallocated as a current band in which to store newly received data; and designating the erased region of storage cells as being the reserve band.

In accordance with another embodiment, controlling settings of the storage cells in the region to reduce the intrinsic charge loss can include: receiving a command to modify the invalid data in the storage cells; and in response to receiving the command, modifying a less-than-all portion of the settings of the data cells in the region to a non-erase state in which the invalid data becomes corrupted.

Modifying the less-than-all portion of settings of the data cells to the non-erase state can includes: changing settings of a first group of cells in the region from a first non-erase state to a second non-erase state to render the invalid data unavailable.

Controlling the time can further include: to reduce the erase dwell time to below a time threshold value, delaying an operation of erasing the second non-erase data in the storage cells in the region and replacing the second non-erase data with the replacement data.

Further method embodiments herein can include performing a partial erase of the region to destroy the invalid data; at least a portion of the storage cells in the region can be set to non-erase states.

In accordance with further embodiments, controlling the time can include: erasing the region of storage cells to destroy the invalid data; and programming the region of storage cells with temporary data prior to overwriting of the temporary data with the replacement data.

As previously discussed, method embodiments can include marking the region as storing invalid data. Marking the region can further include: modifying data stored at a predetermined location in the region to indicate that the region includes invalid data. Method embodiments can further include utilizing settings of the data at the predetermined location to determine that the region stores invalid data.

A second example embodiment as discussed herein includes an apparatus, the apparatus comprises: a non-volatile memory system including multiple non-volatile memory devices; and processing logic configured to: receive notification that data stored in a region of storage cells in the non-volatile memory system stores invalid data; in response to the notification, mark the region as storing invalid data; and control an amount of time in which the region is set to an erase associated with subsequent overwriting of the invalid data in the storage cells with replacement data.

The second example embodiment can be implemented along with any of one or more of the following features to produce yet further embodiments below:

In one embodiment, the time represents an amount of time in which the storage cells are set to an erased state before subsequent overwriting with the replacement data. The processing logic can be further configured to delay an operation of erasing the invalid data in the storage cells in the region and replacing the invalid data with the replacement data. The delayed operation reduces the time to below a predetermined time threshold value.

In accordance with further embodiments, the processing logic is further configured to: monitor a need for storage space in the non-volatile memory system; and erase the invalid data in the storage region in response to detecting a need to store the replacement data in the non-volatile memory system.

In still further embodiments, the processing logic is further configured to: subsequent to erasing the invalid data, initiate storage of the replacement data in the storage cells of the region to ensure that the time in which the storage cells are set to the an erased state is below the predetermined time threshold value.

In another example embodiment, the processing logic is further configured to: reduce a rate of intrinsic charge loss associated with the replacement data stored in the storage cells; the rate of intrinsic charge loss depends on an amount of time in which the settings of the storage cells are set to an erase state prior to storage of the replacement data in the storage cells.

In a further embodiment, the processing logic is further configured to: maintain the settings of the storage cells in a previously programmed state of storing the invalid data until receiving a command to erase the storage cells, the command received in response to detecting that a reserve band in the non-volatile memory system has been reallocated as a current band in which to store newly received data.

The processing logic can be further can be configured to: receive a command to modify the invalid data in the storage cells; and in response to receiving the command, modify a less-than-all portion of the settings of the data cells in the region to a non-erase state.

In accordance with further embodiments, the processing logic can be further configured to: change settings of a first group of cells in the region from a first non-erase state to a second non-erase state to render the invalid data unavailable.

In accordance with yet further embodiments, the processing logic can be further configured to: reduce the time to below a time threshold value, delaying an operation of erasing the second non-erase data in the storage cells in the region and replacing the second non-erase data with the replacement data.

In yet further embodiments, the processing logic can be further configured to: perform a partial erase of the region to destroy the invalid data, at least a portion of the storage cells in the region set to non-erase states.

In one embodiment, the processing logic is further configured to: erase the region of storage cells to destroy the invalid data; and program the region of storage cells with temporary data prior to overwriting of the temporary data with the replacement data.

A computer system can be configured to include the apparatus. Such a computer system can be configured to include host computer processor hardware configured to communicate with the processing logic and store the corresponding data in the memory system.

The non-volatile memory system as discussed herein can be a solid-state drive to which the computer system has access.

The computer system as discussed herein can further include a display screen on which to render an image based at least in part on the corresponding data stored in the solid state-drive.

A third example embodiment as discussed herein includes computer-readable storage hardware (computer readable storage medium) having instructions stored thereon, the instructions, when carried out by computer processor hardware, cause the computer processor hardware to perform one or more operations. The operations can include in response to receiving a notification that data stored in a region of storage cells in a non-volatile memory system stores invalid data, marking the region as storing invalid data; and controlling a time that the region of storage cells is in an erase state associated with subsequent overwriting of the invalid data in the storage cells with replacement data.

The third example embodiment can be implemented along with any of one or more of the following features to produce yet further embodiments below:

In accordance with another computer readable storage medium embodiment, the time represents an amount of time in which the storage cells are set to an erased state before subsequent overwriting with the replacement data. Controlling the time includes: delaying an operation of erasing the invalid data in the storage cells in the region and replacing the invalid data with the replacement data, the delayed operation reducing the time to below a predetermined time threshold value.

In accordance with another embodiment, the computer readable storage medium includes instructions supporting operations of: monitoring a need for storage space in the non-volatile memory system; and erasing the invalid data in the storage region in response to detecting a need to store the replacement data in the non-volatile memory system.

In accordance with another embodiment, the computer readable storage medium includes instructions supporting operations of: subsequent to erasing the invalid data, initiating storage of the replacement data in the storage cells of the region to ensure that the time in which the storage cells are set to an erased state is below the predetermined time threshold value.

In accordance with another embodiment, the computer readable storage medium includes instructions supporting operations of: reducing a rate of intrinsic charge loss associated with the replacement data stored in the storage cells, the rate of intrinsic charge loss depending on an amount of time in which the settings of the storage cells are set to an erase state prior to storage of the replacement data in the storage cells.

In accordance with another embodiment, the computer readable storage medium includes instructions supporting operations of: maintaining the settings of the storage cells in a previously programmed state of storing the invalid data until receiving a command to erase the storage cells, the command received in response to detecting that a reserve band in the non-volatile memory system has been reallocated as a current band in which to store newly received data; and designating the erased region of storage cells as being the reserve band.

In accordance with another embodiment, the computer readable storage medium includes instructions supporting operations of: receiving a command to modify the invalid data in the storage cells; and in response to receiving the command, modifying a less-than-all portion of the settings of the storage cells in the region to be within a non-erase state in which the invalid data becomes corrupted.

In accordance with another embodiment, the computer readable storage medium includes instructions supporting operations of: changing settings of a first group of cells in the region from a first non-erase state to a second non-erase state to render the invalid data unavailable.

In accordance with another embodiment, the computer readable storage medium includes instructions supporting operations of: increasing an erase threshold value associated with the storage cells; and modifying settings of the storage cells to fall within a range defined by the increased erase threshold value.

In accordance with another embodiment, the computer readable storage medium includes instructions supporting operations of: performing a partial erase of the region to destroy the invalid data.

In accordance with another embodiment, the computer readable storage medium includes instructions supporting operations of: erasing the region of storage cells to destroy the invalid data; and programming the region of storage cells with temporary data prior to overwriting of the temporary data with the replacement data.

In accordance with another embodiment, the computer readable storage medium includes instructions supporting operations of: reducing a rate of intrinsic charge loss associated with the replacement data stored in the storage cells.

In accordance with another embodiment, the computer readable storage medium includes instructions supporting operations of: controlling the time to be below a threshold value.

In accordance with another embodiment, the computer readable storage medium includes instructions supporting operations of: modifying data stored at a predetermined location in the region to indicate that the region includes invalid data; and utilizing settings of the data at the predetermined location to determine that the region stores invalid data.

A fourth example embodiment as discussed herein includes a system to manage time, the system comprises: means for receiving notification that data stored in a region of storage cells in a non-volatile memory system stores invalid data; means for marking the region as storing invalid data in response to the notification; and means for controlling an amount of time in which the region is set to an erase associated with subsequent overwriting of the invalid data in the storage cells with replacement data.

The fourth example embodiment can be implemented along with any of one or more of the following features to produce yet further embodiments below:

In one or more example embodiments, the time represents an amount of time in which the storage cells are set to an erased state before subsequent overwriting of the storage cells with the replacement data. Controlling the time includes: delaying an operation of erasing the invalid data in the storage cells in the region and replacing the invalid data with the replacement data, the delayed operation reducing the time to below a predetermined time threshold value.

In one or more example embodiments, the system further comprises: means for monitoring a need for storage space in the non-volatile memory system; and means for erasing the invalid data in the storage region in response to detecting a need to store the replacement data in the non-volatile memory system.

In one or more example embodiments, the system further comprises: means for initiating, subsequent to erasing the invalid data, storage of the replacement data in the storage cells of the region to ensure that the time in which the storage cells are set to an erased state is below the predetermined time threshold value.

In one or more example embodiments, the system further comprises: means for reducing a rate of intrinsic charge loss associated with the replacement data stored in the storage cells, the rate of intrinsic charge loss depending on an amount of time in which the settings of the storage cells are set to an erase state prior to storage of the replacement data in the storage cells.

In one or more example embodiments, the system further comprises: means for maintaining the settings of the storage cells in a previously programmed state of storing the invalid data until receiving a command to erase the storage cells, the command received in response to detecting that a reserve band in the non-volatile memory system has been reallocated as a current band in which to store newly received data; and means for designating the erased region of storage cells as being the reserve band.

In one or more example embodiments, the system further comprises: means for receiving a command to modify the invalid data in the storage cells; and means for modifying a less-than-all portion of the settings of the storage cells in the region to be within a non-erase state in which the invalid data becomes corrupted in response to receiving the command.

In one or more example embodiments, the system further comprises: means for changing settings of a first group of cells in the region from a first non-erase state to a second non-erase state to render the invalid data unavailable.

In one or more example embodiments, the system further comprises: means for increasing an erase threshold value associated with the storage cells; and means for modifying settings of the storage cells to fall within a range defined by the increased erase threshold value.

In one or more example embodiments, the system further comprises: means for performing a partial erase of the region to destroy the invalid data.

Any of the resources as discussed herein can include one or more computerized devices, computer systems, servers, base stations, wireless communication equipment, communication management systems, workstations, handheld or laptop computers, etc., to carry out and/or support any or all of the method operations disclosed herein. In other words, one or more computerized devices or processors can be programmed and/or configured to operate as explained herein to carry out different embodiments.

Yet other embodiments herein include software programs, firmware, logic, etc., to perform operations as disclosed herein. One such embodiment comprises a computer program product including a non-transitory computer-readable storage medium (i.e., any computer readable hardware storage medium) on which software instructions are encoded for subsequent execution. The instructions, when executed in a computerized device having one or more processors, program and/or cause the processor to perform the operations disclosed herein. Such arrangements can be provided as software, firmware, code, instructions, data (e.g., data structures), etc., arranged or encoded on a non-transitory computer readable storage medium such as an optical medium (e.g., CD-ROM), floppy disk, hard disk, memory, etc., or other a medium such as firmware or shortcode in one or more ROM, RAM, PROM, etc., or as logic in an Application Specific Integrated Circuit (ASIC), etc. The software or firmware or other such configurations can be installed onto a computerized device to cause the computerized device to perform the techniques explained herein.

Accordingly, embodiments herein are directed to an apparatus, a method, a system, a computer program product, etc., that supports operations as discussed herein.

One embodiment includes a computer readable storage medium and/or system having instructions, logic, etc., stored thereon to manage data in a memory system including one or more non-volatile memory devices. The instructions, and/or logic, when executed by at least one processor device of a respective computer, cause the at least one processor device to: receive notification that data stored in a region of storage cells in a non-volatile memory system stores invalid data; in response to the notification, mark the region as storing invalid data; and control an time associated with overwriting of the invalid data in the storage cells with replacement data.

Note that any of the processing as discussed herein can be performed in any suitable order.

It is to be understood that the apparatus, system, method, apparatus, instructions on computer readable storage media, etc., as discussed herein also can be embodied strictly as a software program, firmware, as a hybrid of software, hardware and/or firmware, or as hardware alone such as within a processor device, within an operating system or a within a software application, etc.

Additionally, note that although each of the different features, techniques, configurations, etc., herein may be discussed in different places of this disclosure, it is intended, where suitable, that each of the concepts can optionally be executed independently of each other or in combination with each other. Any permutation of the disclosed features is possible. Accordingly, the one or more embodiments as described herein can be embodied and viewed in many different ways.

Note further that techniques herein are well suited for use in memory systems including one or more non-volatile memory device. However, it should be noted that embodiments herein are not limited to use in such applications and that the techniques discussed herein are well suited for other applications as well.

While details have been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the embodiments herein are presented in the following claims.

The invention claimed is:

1. A method comprising:
in response to receiving a notification that data stored in a region of storage cells in a non-volatile memory system is invalid data, marking the region as storing the invalid data;
limiting an amount of time that the region of storage cells is in an erase state associated with subsequent overwriting of the invalid data in the storage cells with replacement data; and
wherein limiting the amount of time includes: delaying an operation of erasing the invalid data in the storage cells in the region, the delayed operation reducing the time to below a predetermined time threshold value.

2. The method as in claim 1, wherein limiting the amount of time further includes:
subsequent to erasing the invalid data in the storage cells in the region, storing the replacement data in the erased storage cells.

3. The method as in claim 1, wherein delaying the operation of erasing the invalid data includes:
monitoring a need for storage space in the non-volatile memory system; and
erasing the invalid data in the storage region in response to detecting a need to store the replacement data in the non-volatile memory system.

4. The method as in claim 3 further comprising:
subsequent to erasing the invalid data, initiating storage of the replacement data in the storage cells of the region to ensure that the amount of time in which the storage cells are set to an erased state is below the predetermined time threshold value.

5. The method as in claim 1, wherein limiting the amount of time includes:
reducing a rate of intrinsic charge loss associated with the replacement data stored in the storage cells, the rate of intrinsic charge loss depending on the time in which the settings of the storage cells are set to the erase state prior to storage of the replacement data in the storage cells.

6. The method as in claim 1, wherein limiting the amount of time includes:
maintaining the settings of the storage cells in a previously programmed state of storing the invalid data until receiving a command to erase the storage cells, the command received in response to detecting that a reserve band in the non-volatile memory system has been reallocated as a current band in which to store newly received data; and
designating the erased region of storage cells as being the reserve band.

7. The method as in claim 1 further comprising:
receiving a command to modify the invalid data in the storage cells; and
in response to receiving the command, modifying a less-than-all portion of the settings of the storage cells in the region to be in a non-erase state in which the invalid data becomes corrupted.

8. The method as in claim 7, wherein modifying the less-than-all portion of settings of the storage cells to the non-erase state includes:
changing settings of a first group of cells in the region from a first non-erase state to a second non-erase state to render the invalid data unavailable.

9. The method as in claim 1 further comprising:
increasing an erase threshold voltage value associated with the storage cells; and
modifying settings of the storage cells to fall within a range defined by the increased erase threshold voltage value.

10. The method as in claim 1 further comprising:
performing a partial erase of the region to delete the invalid data.

11. The method as in claim 1, wherein limiting the amount of time includes:
erasing the region of storage cells to delete the invalid data; and
programming the region of storage cells with temporary data prior to overwriting of the temporary data with the replacement data.

12. The method as in claim 1
wherein limiting the amount of time includes: reducing a rate of intrinsic charge loss associated with the replacement data stored in the storage cells.

13. The method as in claim 1, wherein limiting the amount of time includes: controlling the amount of time to be below a threshold value.

14. The method as in claim 1, wherein marking the region includes:
modifying data stored at a predetermined location in the region to indicate that the region includes invalid data, the method further comprising:

utilizing settings of the data at the predetermined location to determine that the region stores invalid data.

15. The method as in claim 1, wherein limiting the amount of time includes: activating a timer to track the amount of time that the region of storage cells is in the erase state.

16. The method as in claim 15 further comprising:
in response to detecting that the timer reaches a time threshold value indicating that the region of storage cells has been in the erase state for a pre-determined amount of time, completing writing of data to any unwritten portion of the region of storage cells.

17. The method as in claim 16 further comprising:
subsequent to erasing the invalid data in the region of storage cells, writing new data to the storage cells in the region on an as-needed basis as the new data becomes available for storage.

18. The method as in claim 1 further comprising:
subsequent to erasing the invalid data in the region of storage cells, writing new data to the storage cells in the region on an as-needed basis as the new data becomes available for storage.

19. An apparatus for storing data, the apparatus comprising:
a non-volatile memory system including multiple non-volatile memory devices; and
processing logic configured to:
receive notification that data stored in a region of storage cells in the non-volatile memory system is invalid data;
in response to the notification, mark the region as storing the invalid data; and
limit an amount of time that the region is set to an erase state associated with subsequent overwriting of the invalid data in the storage cells with replacement data, the amount of time limited to below a threshold value.

20. The apparatus as in claim 19,
wherein the processing logic is further configured to delay an operation of erasing the invalid data in the storage cells in the region and replacing the invalid data with the replacement data, the delayed operation reducing the time to below the threshold value.

21. The apparatus as in claim 20, wherein the processing logic is further configured to:
monitor a need for storage space in the non-volatile memory system; and
erase the invalid data in the storage region in response to detecting a need to store the replacement data in the non-volatile memory system.

22. The apparatus as in claim 21, wherein the processing logic is further configured to:
subsequent to erasing the invalid data, initiate storage of the replacement data in the storage cells of the region to ensure that the time in which the storage cells are set to the erased state is below the threshold value.

23. The apparatus as in claim 20, wherein the processing logic is further configured to:
reduce a rate of intrinsic charge loss associated with the replacement data stored in the storage cells, the rate of intrinsic charge loss depending on an amount of the time in which the settings of the storage cells are set to the erase state prior to storage of the replacement data in the storage cells.

24. The apparatus as in claim 19, wherein the processing logic is further configured to:
maintain the settings of the storage cells in a previously programmed state of storing the invalid data until receiving a command to erase the storage cells, the command received in response to detecting that a reserve band in the non-volatile memory system has been reallocated as a current band in which to store newly received data.

25. A computer system including the apparatus in claim 19, the computer system further comprising:
host computer processor hardware configured to communicate with the processing logic and store the corresponding data in the memory system.

26. A computer system including the apparatus in claim 19, wherein the non-volatile memory system is a solid-state drive to which the computer system has access.

27. The computer system as in claim 26, the computer system further comprising:
a display screen on which to render an image based at least in part on the corresponding data stored in the solid state-drive.

28. Non-transitory computer-readable media having instructions stored thereon, the instructions, when carried out by computer processor hardware, cause the computer processor hardware to perform operations of:
in response to receiving a notification that a region of storage cells in a non-volatile memory system stores invalid data, marking the region as storing the invalid data;
limiting a time that the region of storage cells is in an erase state before subsequent overwriting of the storage cells with replacement data; and
wherein limiting the time includes: controlling the time to be below a threshold value.

29. The non-transitory computer-readable media as in claim 28, wherein controlling the time includes: delaying an operation of erasing the invalid data in the storage cells in the region and replacing the invalid data with the replacement data, the delayed operation reducing the time to below the threshold value.

* * * * *